(12) United States Patent
Hertkorn et al.

(10) Patent No.: US 10,354,865 B2
(45) Date of Patent: Jul. 16, 2019

(54) METHOD FOR PRODUCING A NITRIDE COMPOUND SEMICONDUCTOR DEVICE

(71) Applicant: OSRAM Opto Semiconductors GmbH, Regensburg (DE)

(72) Inventors: Joachim Hertkorn, Wörth an der Donau (DE); Lorenzo Zini, Regensburg (DE); Alexander Frey, Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 5 days.

(21) Appl. No.: 15/573,468

(22) PCT Filed: May 11, 2016

(86) PCT No.: PCT/EP2016/060575
§ 371 (c)(1),
(2) Date: Nov. 12, 2017

(87) PCT Pub. No.: WO2016/184752
PCT Pub. Date: Nov. 24, 2016

(65) Prior Publication Data
US 2018/0144933 A1    May 24, 2018

(30) Foreign Application Priority Data

May 15, 2015    (DE) .................. 10 2015 107 661

(51) Int. Cl.
*H04L 21/02* (2006.01)
*C30B 25/04* (2006.01)
(Continued)

(52) U.S. Cl.
CPC ........ *H01L 21/02458* (2013.01); *C30B 25/04* (2013.01); *C30B 25/18* (2013.01);
(Continued)

(58) Field of Classification Search
CPC ... H01L 2924/00; H01L 33/007; H01L 33/22; H01L 21/0254; H01L 21/02458;
(Continued)

(56) References Cited

U.S. PATENT DOCUMENTS 6,325,850 B1 * 12/2001 Beaumont ............... C30B 25/02
                                                                    117/95
9,337,388 B2    5/2016 Hertkorn et al.
(Continued)

FOREIGN PATENT DOCUMENTS

DE    102010048617 A1    4/2012
DE    102012217644 A1    3/2014
(Continued)

OTHER PUBLICATIONS

Chelda-Gourmala, O. et al., "Complete HVPE Experimental Investigations: Cartography of SAG GaN towards Quasi-Substrates or Nanostructures," Journal of Crystal Growth 312, 2010, 9 pages.

*Primary Examiner* — Jonathan Han
(74) *Attorney, Agent, or Firm* — Slater Matsil, LLP

(57)    ABSTRACT

A method for procuring a nitride compound semiconductor device is disclosed. In an embodiment the method includes growing a first nitride compound semiconductor layer onto a growth substrate, depositing a masking layer, growing a second nitride compound semiconductor layer onto the masking layer, growing a third nitride compound semiconductor layer onto the second nitride compound semiconductor layer such that the third nitride compound semiconductor layer has non-planar structures and growing a fourth nitride compound semiconductor layer onto the non-planar structures such that the fourth nitride compound semiconductor layer has an essentially planar surface. The method further includes growing a functional layer sequence of the nitride compound semiconductor device, connecting a side of the
(Continued)

functional layer sequence located opposite to the growth substrate to a carrier and removing the growth substrate.

14 Claims, 4 Drawing Sheets

(51) Int. Cl.
    *H01L 21/02*     (2006.01)
    *C30B 29/40*     (2006.01)
    *C30B 25/18*     (2006.01)
    *C30B 33/10*     (2006.01)

(52) U.S. Cl.
    CPC ............ *C30B 29/403* (2013.01); *C30B 33/10* (2013.01); *H01L 21/0254* (2013.01); *H01L 21/0262* (2013.01); *H01L 21/02639* (2013.01); *H01L 21/02647* (2013.01)

(58) Field of Classification Search
    CPC ............... H01L 33/0079; H01L 33/32; H01L 21/02639; H01L 33/0075; H01L 33/24
    USPC ............ 257/98, E21.131, 103, 40, E21.108, 257/E33.001; 438/22, 46, 49
    See application file for complete search history.

(56) References Cited

U.S. PATENT DOCUMENTS

| | | | |
|---|---|---|---|
| 9,466,759 | B2 | 10/2016 | Hertkorn et al. |
| 9,647,174 | B2* | 5/2017 | Hertkorn ............ H01L 21/0242 |
| 2003/0183157 | A1 | 10/2003 | Usui et al. |
| 2006/0266281 | A1 | 11/2006 | Beaumont et al. |
| 2009/0061636 | A1* | 3/2009 | Lee .................. H01L 21/30617 438/703 |
| 2011/0050082 | A1* | 3/2011 | Inoue ................. H01L 51/5268 313/483 |
| 2014/0061694 | A1* | 3/2014 | Leirer ................ H01L 21/0237 257/95 |
| 2015/0364647 | A1* | 12/2015 | Timmering ............ H01L 33/22 257/76 |

FOREIGN PATENT DOCUMENTS

| | | |
|---|---|---|
| EP | 1071143 A1 | 1/2001 |
| EP | 1806790 A2 | 7/2007 |
| JP | 11260737 A | 9/1999 |
| JP | 3839580 B2 * | 11/2006 |

* cited by examiner

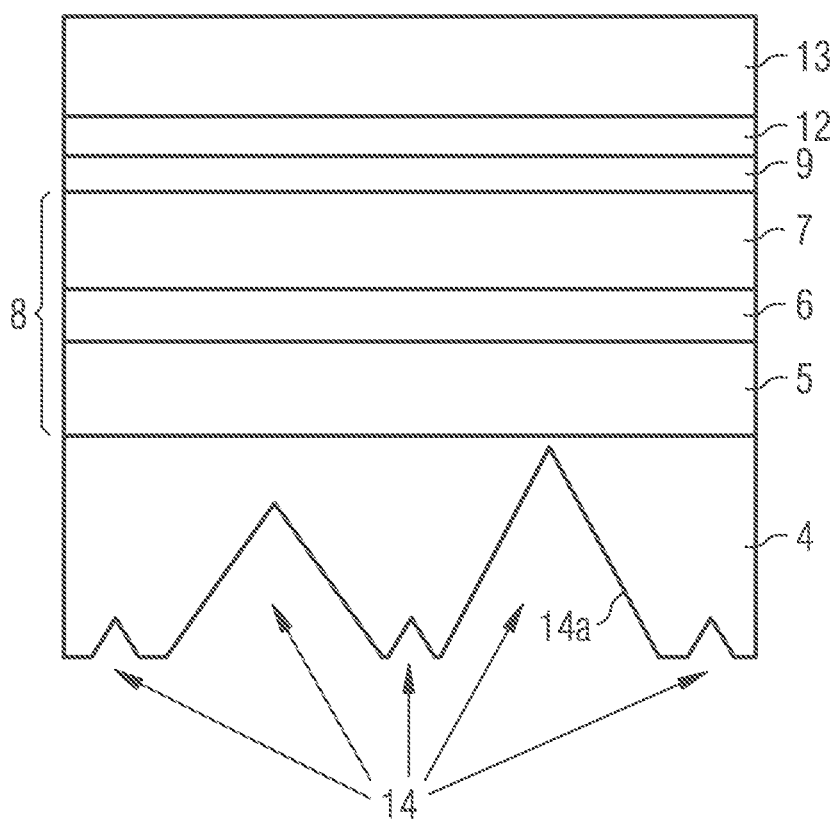

METHOD FOR PRODUCING A NITRIDE COMPOUND SEMICONDUCTOR DEVICE

This patent application is a national phase filing under section 371 of PCT/EP2016/060575, filed May 11, 2016, which claims the priority of German patent application 10 2015 107 661.6, filed May 15, 2015, each of which is incorporated herein by reference in its entirety.

TECHNICAL FIELD

The invention relates to a method of producing a nitride compound semiconductor device and, in particular, an optoelectronic nitride compound semiconductor device.

BACKGROUND

For producing nitride compound semiconductor devices such as LEDs or semiconductor lasers, the functional layers of the device are usually epitaxially deposited on a suitable growth substrate. Sapphire substrates are especially suited for growing nitride compound semiconductor layers thereonto. When a nitride compound semiconductor is heteroepitaxially grown onto sapphire, defects may form in the semiconductor material owing to the lattice mismatch present, which defects may impair the properties of the device.

For a nitride compound semiconductor based device, it has turned out to be advantageous to connect the side of the epitaxial layer sequence which is disposed opposite the growth substrate to a carrier and to subsequently remove the growth substrate therefrom. For removing the growth substrate from a nitride compound semiconductor device, in particular a per se known laser lift-off method can be used. An LED produced in this manner is also referred to as a thin-film LED. In order to improve the coupling-out of radiation, a coupling-out-out structure or a roughened area can be provided on a surface located opposite the carrier.

SUMMARY OF THE INVENTION

Embodiments of the invention provide an enhanced method for producing a nitride compound semiconductor device which in particular results in low defect density. Moreover, the specific formation of coupling-out structures may be facilitated which structures influence the radiation characteristics of the device.

The following describes an embodiment of the method for producing the nitride semiconductor compound:

A growth substrate is provided onto which a first nitride compound semiconductor layer is then grown.

Here and in the following, the wording that a layer or an element is disposed or deposited "on" or "over" another layer or another element can mean that such layer or element is directly disposed on the respective other layer or element in direct mechanical and/or electrical contact therewith. Furthermore, it can also mean that such layer or element is indirectly disposed on or over the respective other layer or element. In this case, additional layers and/or elements can also be disposed between the one and the other layer or between the one and the other element, respectively.

Before growing the first nitride compound semiconductor layer, a nucleation layer, for example, a layer containing aluminum nitride, is preferably first deposited. The nucleation layer may be deposited by sputtering, for example. The first nitride compound semiconductor layer and the additional nitride compound semiconductor layers deposited in subsequent additional method steps are preferably epitaxially deposited, in particular by metal organic vapor phase epitaxy (MOVPE).

Advantageously, a masking layer is deposited on the first nitride compound semiconductor layer. Owing to its structure and/or its surface characteristics, the masking layer allows a second nitride compound semiconductor layer to be selectively grown thereon. The masking layer may in particular include or consist of SiN or SiGaN. The masking layer is preferably a non-continuous layer having a plurality of randomly distributed openings. More specifically, the masking layer can be a layer in the form of islands, i.e., a layer whose growth was stopped in the initial phase before the crystallites were even able to grow together completely to yield a continuous layer. The thickness of the masking layer is preferably only one or few atomic layer(s). The masking layer can be of an average thickness of approx. 0.2 nm to 2 nm, for example. Preferably, the masking layer is deposited by means of MOVPE.

In another method step, a second nitride compound semiconductor layer is grown onto the masking layer. When growing the second nitride compound semiconductor layer, three-dimensional islands will be formed from the nitride compound semiconductor material owing to the structure and/or the surface characteristics of the masking layer. For example, nucleation of the nitride compound semiconductor material of the second nitride compound semiconductor layer will start in openings in the masking layer. The three-dimensional islands can at least partially grow over the masking layer material. Growth of the second nitride compound semiconductor layer is preferably stopped before the three-dimensional islands grow together to form a continuous layer.

In a subsequent step, a third nitride compound semiconductor layer is grown onto the second nitride compound semiconductor layer. When growing the third nitride compound semiconductor layer, growth conditions, in particular temperature and/or gas flows, are adjusted so as to yield predominantly three-dimensional growth. Predominantly three-dimensional growth in particular means that the surface of the third nitride compound semiconductor layer is substantially constituted by crystal faces which do not extend parallel to the growth substrate. More specifically, the majority of the crystal faces of the third nitride compound semiconductor layer are not oriented in the c-plane. The c-plane in particular corresponds to a [0001] crystal face of the nitride compound semiconductor material. Growth of the third nitride compound semiconductor layer in the [0001] crystal direction is preferably negligibly low. Owing to the growth conditions, the third nitride compound semiconductor layer will form non-planar three-dimensional structures, in particular pyramidal structures.

According to the method, a fourth nitride compound semiconductor layer is advantageously grown onto the non-planar structures of the third nitride compound semiconductor layer, for which purpose growth conditions are set so as to yield predominantly two-dimensional growth. Predominantly two-dimensional growth in particular means that the surface of the fourth nitride compound semiconductor layer is substantially constituted by crystal faces which extend parallel to the growth substrate. In particular, the surface of the fourth nitride compound semiconductor layer is mostly oriented in the c-plane which plane corresponds to the [0001] crystal face of the nitride compound semiconductor material. The fourth nitride compound semiconductor layer preferably completely covers the non-planar structures of the third nitride compound semiconductor layer and has an essentially planar surface. In other words, the non-planar structures of the fourth nitride compound semiconductor layer are preferably completely planarized.

In one embodiment, an intermediate step can be performed after growing the third nitride compound semiconductor layer and before growing the fourth nitride compound semiconductor layer, in which step an additional masking layer, preferably of SiN, is grown and subsequently another nitride compound semiconductor layer is grown under predominantly three-dimensional growth conditions, i.e., under growth conditions such as described with reference to the third nitride compound semiconductor layer. This intermediate step can be repeated once or several times, if necessary. This can enhance the formation of the pyramidal structures. Following this intermediate step, the fourth nitride compound semiconductor layer is then grown in this embodiment, as described above.

In a subsequent step, the functional layer sequence of the nitride compound semiconductor device is then grown onto the preferably completely planar surface of the fourth nitride compound semiconductor layer. The functional layer sequence may in particular be a light-emitting diode layer sequence.

In one advantageous embodiment, in a further method step, the functional layer sequence, on a side thereof which is disposed opposite the growth substrate, is connected to a carrier. Subsequently, the growth substrate is removed from the semiconductor layer sequence produced in this way. Removing the growth substrate is preferably performed using a laser lift-off process. As an alternative, however, the growth substrate can also be removed using a wet chemical method, by applying ultrasound, by generating mechanical shearing forces, for example, through a temperature treatment, or by applying mechanical force. The relatively expensive growth substrate, which in particular includes sapphire, may advantageously be reused after its removal.

In one advantageous embodiment, in a further step, coupling-out structures are generated on a surface of the device which faces away from the carrier, by means of an etching process, which etching process acts to remove at least parts of the first, second and third nitride compound semiconductor layers.

It has turned out that the boundary surface between the third nitride compound semiconductor layer and the fourth nitride compound semiconductor layer functions like an etch stop layer in the etching process. The etching process is slowed down or even stopped completely at this boundary surface. It is assumed that this especially results from the fact that defects at the surfaces of the non-planar structures of the third nitride compound semiconductor layer will kink when growth conditions are changed between production of the third nitride compound semiconductor layer and of the fourth nitride compound semiconductor layer. When the coupling-out structures are being produced, the etching process is thus stopped in particular at the non-planar boundary surface between the third and fourth nitride compound semiconductor layers. At least part of the coupling-out structures are thus constituted by non-planar surfaces of the fourth nitride compound semiconductor layer, which non-planar surfaces had previously formed the boundary surface to the third nitride compound semiconductor layer. The third nitride compound semiconductor layer is removed in full or in part during the etching process. In other words, the coupling-out structures are inverse to the non-planar structures formed during the production of the third nitride compound semiconductor layer.

In this method, the form and/or the size of the coupling-out structures is advantageously defined by the non-planar structures formed during the production of the second and third nitride compound semiconductor layers. These may be influenced regarding size and distribution by the masking layer. Furthermore, the form of the non-planar structures may be determined by suitably setting the conditions and period of growth during the production of the third nitride compound semiconductor layer.

Preferably, the formation of the non-planar structures when growing the third nitride compound semiconductor layer is monitored by a suitable process, in particular by in-situ reflectometry. For example, the reflection of a laser beam can be measured at normal incidence. The reflection at normal incidence decreases as the size of the non-planar structures increases since the latter act to laterally deflect or diffuse the laser beam. This makes it possible to stop growth of the third nitride compound semiconductor layer once the non-planar structures have reached a desired size.

The non-planar structures of the third nitride compound semiconductor layer may in particular be substantially pyramidal structures. The pyramidal structures are advantageously formed in a self-organized manner during the three-dimensional growth of the third nitride compound semiconductor layer. More specifically, the pyramidal structures may have side facets constituted by a [1-101] crystal face or a [11-22] crystal face. Similarly, the coupling-out structures formed during etching also have side facets constituted by a [1-101] crystal face or a [11-22] crystal face.

In another advantageous embodiment, the non-planar structures are of an average height of between 1 μm and 5 μm, preferably of between 2 μm and 3 μm.

The etching process for producing the coupling-out structures is advantageously performed in a wet chemical way, preferably using KOH as an etchant. In the wet chemical etching process, the etching agent in particular penetrates the semiconductor material along dislocations which extend in the vertical direction. Boundary surfaces at which dislocations kink away from the vertical direction, e.g., into the c-plane extending in the lateral direction, will thus slow down or stop the etching process.

In another advantageous embodiment, the second nitride compound semiconductor layer and/or the fourth nitride compound semiconductor layer are produced at a growth temperature of above 1,050° C. This growth temperature results in primarily two-dimensional growth.

The third nitride compound semiconductor layer is preferably produced at a growth temperature which is lower by at least 40° C., preferably by between 50° C. and 80° C., than the growth temperature used for growing the second and/or fourth nitride compound semiconductor layers. The lower growth temperature used for growing the third nitride compound semiconductor layer favors the formation of the three-dimensional non-planar structures.

Preferably, the nitride compound semiconductor layers are produced by means of metal organic vapor phase epitaxy (MOVPE) using $NH_3$ as a reaction gas for providing the nitrogen component. Preferably, the $NH_3$ gas flow is at least 70%, preferably between 70% and 90%, lower when producing the second and third nitride compound semiconductor layers than when producing the fourth nitride compound semiconductor layer. Same as the lower growth temperature, the reduced $NH_3$ gas flow favors the formation of the three-dimensional non-planar structures.

The masking layer used in the method is preferably a silicon nitride layer. It is relatively difficult to grow a nitride compound semiconductor onto silicon nitride. The silicon nitride masking layer therefore results in selective growth of the second nitride compound semiconductor layer into openings in the masking layer and/or in the form of individual islands which laterally overgrow the masking layer.

The growth substrate used for the method is preferably a sapphire substrate. Since the method provides for the growth substrate to be advantageously removed after connection to a carrier, this allows the relatively expensive growth substrate to be reused advantageously.

The functional layer sequence preferably contains an n-doped semiconductor region, a p-doped semiconductor region and an active layer disposed between the n-doped and p-doped semiconductor regions. This active layer is preferably a layer which is suitable for the emission of electromagnetic radiation. In particular, the nitride compound semiconductor device may be a light-emitting diode.

BRIEF DESCRIPTION OF THE DRAWINGS

The invention is explained in more detail below with reference to embodiments illustrated in FIGS. 1 to 7.

In the drawings,

FIGS. 1 to 7 are schematic views of an embodiment of the method which each illustrate an intermediate method step.

In the Figures, identical or identically acting components are in each case provided with the same reference numerals. The components illustrated and the size ratios of the components to one another should not be regarded as to scale.

DETAILED DESCRIPTION OF ILLUSTRATIVE EMBODIMENTS

Figure 1:
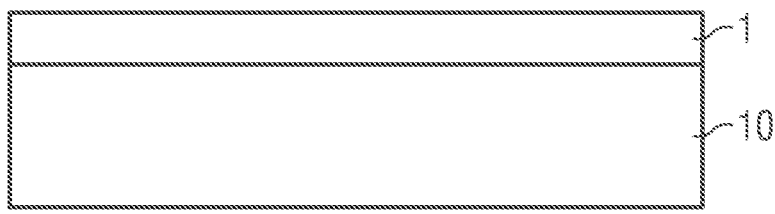

In the first step of the method as schematically illustrated in FIG. 1, a first nitride compound semiconductor layer 1 has been grown onto a growth substrate 10. The growth substrate 10 is preferably a sapphire substrate.

The first nitride compound semiconductor layer 1 shown here, same as the additional nitride compound semiconductor layers deposited in subsequent method steps, comprises a III nitride compound semiconductor material, preferably $In_xAl_yGa_{1-x-y}N$, with $0 \leq x \leq 1$, $0 \leq y \leq 1$ and $x+y \leq 1$. However, this material does not necessarily have to be of a mathematically exact composition according to the above formula. In fact, it may include one or plural dopants as well as additional components which will basically not change the characteristic physical properties of the $In_xAl_yGa_{1-x-y}N$ material. For the sake of simplicity, the above formula only contains the most essential components of the crystal lattice (In, Al, Ga, N) even if these may partially be replaced by small amounts of other substances. The first nitride compound semiconductor layer 1 may in particular be a GaN layer.

Growing the first nitride compound semiconductor layer 1 is performed in the same way as growing the additional nitride compound semiconductor layers, preferably by means of metal organic vapor phase epitaxy (MOVPE). The first nitride compound semiconductor layer 1 preferably has a thickness of between 10 nm and 1,000 nm, for example, of approx. 300 nm.

It is possible to deposit a thin nucleation layer (not shown) on the growth substrate 10, for example, by sputtering, before growing the first nitride compound semiconductor layer 1. The nucleation layer can in particular contain AlN.

Figure 2:
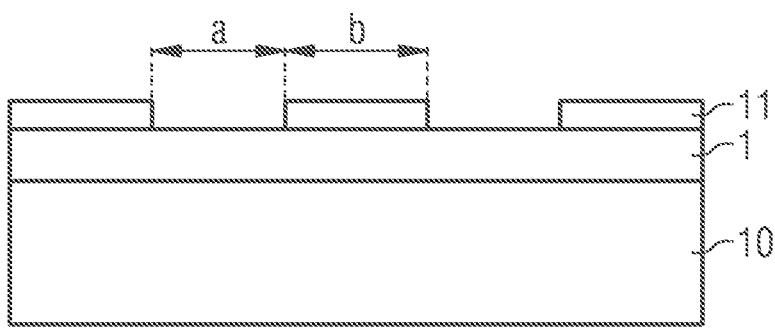

In the intermediate step of FIG. 2, a masking layer 11 has been deposited on the first nitride compound semiconductor layer 1. The masking layer 11 is formed from a material onto which a nitride compound semiconductor cannot be grown easily. The masking layer 11 is preferably a silicon nitride layer. The masking layer 11 preferably has a plurality of openings of an average lateral extent of between approx. 100 nm and 1,000 nm. The areas of the masking layer 11 disposed between the openings advantageously have a lateral extent b of between approx. 10 nm and 500 nm.

Figure 3:
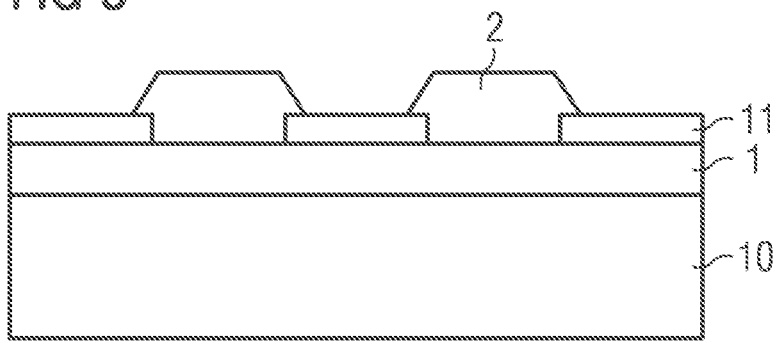

In the intermediate step of FIG. 3, a second nitride compound semiconductor layer 2 has been grown onto the first nitride compound semiconductor layer 1 and the masking layer 11. The second nitride compound semiconductor layer 2 grows primarily in the openings in the masking layer, in which case the material of the second nitride compound semiconductor layer 2 can laterally overgrow at least part of the masking layer 11. The second nitride compound semiconductor layer 2 is, for example, deposited by means of MOVPE using an $NH_3$ gas flow of between 10 slm and 50 slm at a growth rate of 1 μm/h.

The second nitride compound semiconductor layer 2 is preferably grown at a growth temperature of above 1,050° C. The growth temperature is in particular chosen so as to produce substantially two-dimensional growth. In other words, the nitride compound semiconductor material of the second nitride compound semiconductor layer 1 essentially grows in a [0001] crystal direction, with the surface of the growing crystallites being thus constituted primarily by a [0001] crystal plane which is also referred to as the c-plane. The growth of the second nitride compound semiconductor layer 2 is advantageously stopped before the growing crystallites have coalesced.

Figure 4:
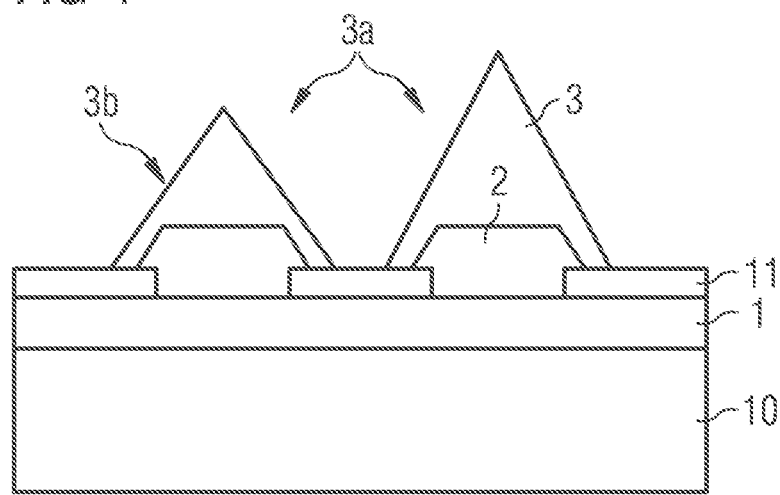

In another method step schematically illustrated in FIG. 4, a third nitride compound semiconductor layer 3 has been grown onto the second nitride compound semiconductor layer 2. For growing the third nitride compound semiconductor layer 3, growth conditions are changed so as to yield essentially three-dimensional growth of the crystallites. In particular, this can be brought about by reducing the growth temperature by at least 40° C., preferably by approx. 50° C. to 80° C., relative to the growth temperature of the second nitride compound semiconductor layer 2.

More specifically, the third nitride compound semiconductor layer 3 essentially grows in crystal directions that do not correspond to the [0001] crystal direction. Growing the third nitride compound semiconductor layer 3 produces three-dimensional non-planar structures which may in particular be pyramidal. The side facets 3a of the pyramidal structures are in particular constituted by a [1-101] crystal face or a [11-22] crystal face.

Growth of the third nitride compound semiconductor layer 3 is preferably stopped once the growing three-dimensional structures have completely coalesced to yield pyramidal structures of a desired height. Growth may be monitored in situ in the coating installation by means of reflectometry, for example. For this purpose, a laser beam is, for example, directed onto the growth surface at a normal incident angle, i.e., parallel to the direction of growth, and the reflectivity of the surface is then determined from the reflected intensity measured with a detector. Reflectivity decreases as the pyramidal structures increase in size. Calibration of the reflectivity of the surface thus provides information on the size of the pyramidal structures. Advantageously, pyramidal structures are produced having a height of between 1 μm and 5 μm, preferably of between 2 μm and 3 μm.

Figure 5:
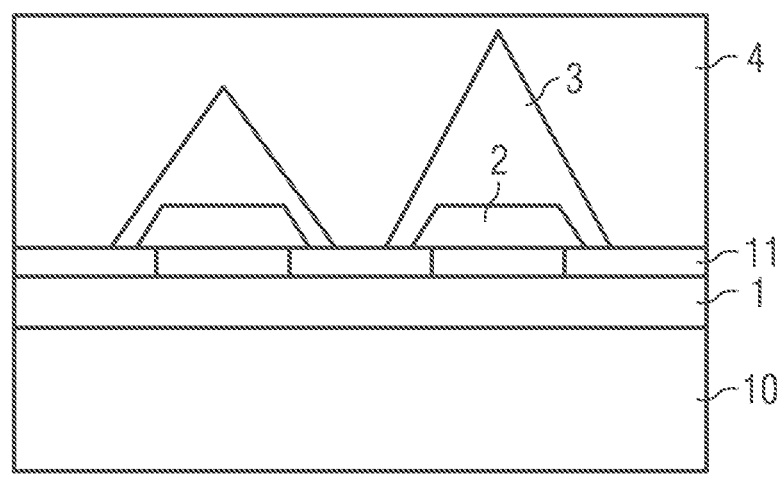

In the additional method step illustrated in FIG. 5, a fourth nitride compound semiconductor layer 4 has been grown onto the non-planar structures of the third nitride compound semiconductor layer 3. For growing the fourth nitride compound semiconductor layer 4, growth conditions are changed again. Same as when growing the second nitride compound semiconductor layer 2, growth conditions are set so as to yield essentially two-dimensional growth. This allows the pyramidal structures to be overgrown in such a way that an essentially planar surface is obtained. It has turned out that defects kink at the boundary surfaces of the non-planar structures, in particular at the [1-101] crystal faces or the [11-22] crystal faces which are inclined relative to the growth substrate. The defect density in the fourth nitride compound semiconductor layer 4 is thus particularly low. In particular, changing the growth conditions twice from essentially two-dimensional growth to essentially three-dimensional growth and vice versa allows a particularly low defect density to be achieved in the nitride compound semiconductor material of the fourth nitride compound semiconductor layer 4.

The growth conditions when growing the fourth nitride compound semiconductor layer 4 may in particular be identical to the growth conditions for growing the second nitride compound semiconductor layer 2. In particular when growing the fourth nitride compound semiconductor layer 4, the growth temperature is increased relative to the growth temperature of the third nitride compound semiconductor layer 3, preferably by 50° C. to 80° C. For example, the growth temperature is raised by approx. 75° C. When growing the fourth nitride compound semiconductor layer 4, the $NH_3$ gas flow can be increased as well. Preferably, the $NH_3$ gas flow when growing the second and third nitride compound semiconductor layers 2, 3 is between approx. 10% and 30% of the value present when the fourth nitride compound semiconductor layer 4 is grown. When growing the second nitride compound semiconductor layer 2 and the third nitride compound semiconductor layer 3, the $NH_3$ gas flow can be approx. 10 slm and when growing the fourth nitride compound semiconductor layer 4 the $NH_3$ gas flow can be approx. 50 slm. However, it is also possible to keep the $NH_3$ gas flow constant and to only raise the growth temperature when growing the fourth nitride compound semiconductor layer 4.

Figure 6:
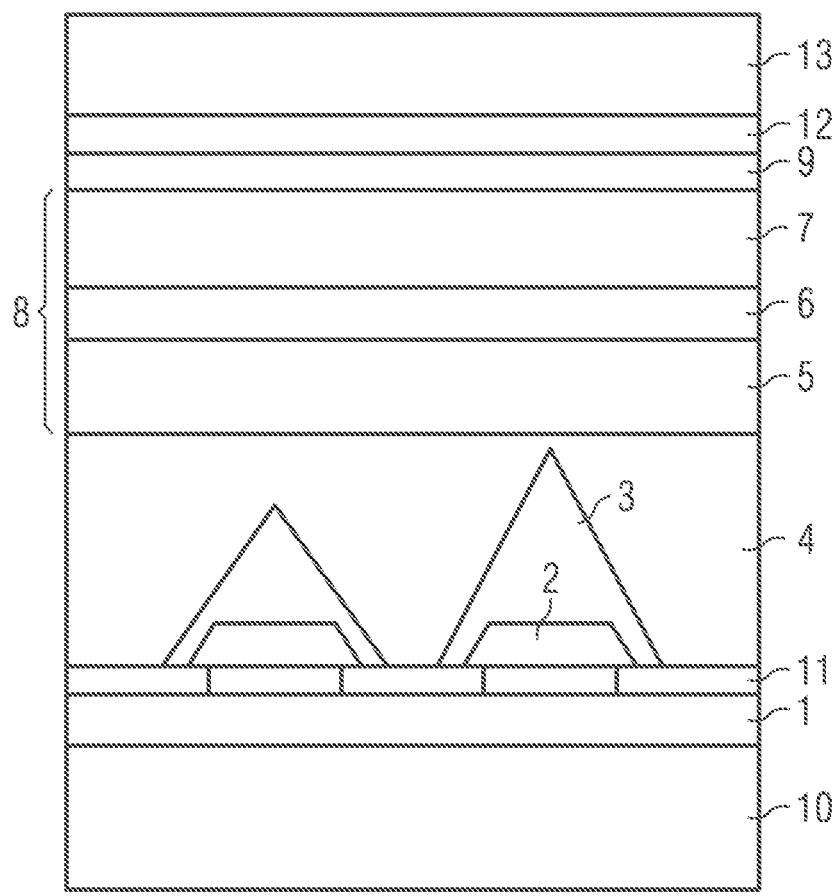

In the subsequent method step which is illustrated in FIG. 6, the essentially planar surface of the fourth nitride compound semiconductor layer 4 is then used for growing a functional semiconductor layer sequence 8 thereonto. The quality of the functional semiconductor layer sequence 8 benefits in particular from low defect density in the fourth nitride compound semiconductor layer 4 onto which it is grown. In particular, the functional semiconductor layer sequence 8 is characterized by very low defect density which is achieved in particular by changing the growth conditions of the subjacent nitride compound semiconductor layers 2, 3, 4 twice.

The functional semiconductor layer sequence 8 may in particular be a light-emitting semiconductor layer sequence of an optoelectronic device. For example, the nitride compound semiconductor device is an LED and the functional semiconductor layer sequence 8 is a light-emitting diode layer sequence. In particular, the functional semiconductor layer sequence 8 can have an n-type semiconductor region 5, an active layer 6 and a p-type semiconductor region 7. The light-emitting diode layer sequence only shown in simplified form can be composed of a plurality of single layers, and because such layer sequences are per se known, they shall not be discussed in more detail here.

Furthermore, in the intermediate step shown in FIG. 6, on its side opposite the growth substrate 10, the functional semiconductor layer sequence 8 has been connected to a carrier 13. The carrier 13 may in particular be a silicon wafer. The carrier 13 can be connected to the functional semiconductor layer sequence 8 by means of a connection layer 12 such as a solder layer. Advantageously, the functional semiconductor layer sequence 8 is provided with a mirror layer 9 before it is connected to the carrier 13, which mirror layer 9 serves to reflect the radiation emitted in the direction of the carrier 13 in the finished nitride compound semiconductor device toward the opposite radiation exit surface and to thus increase the radiation yield. The mirror layer 9 may comprise silver or aluminum, for example. Furthermore, the functional semiconductor layer can be provided with electrical contacts (not shown). An electrical contact can be constituted by an electrically conductive mirror layer 9, for example. Furthermore it is possible to provide vias for electrical contacting which extend into the n-type semiconductor region 7. Such options for electrical contacting are per se known and thus not illustrated in detail in the Figures.

In the method step shown in FIG. 7, the growth substrate 10 has been removed from the layer sequence produced. The growth substrate 10 may, for example, be removed from the layer sequence using a laser lift-off process. As an alternative, the growth substrate 10 may be removed using ultrasound, a wet chemical process, by generating shearing forces, in particular through a temperature treatment, or through the application of purely mechanical force.

Furthermore, an etching process has been conducted which was used to at least partially remove the first nitride compound semiconductor layer 1, the masking layer 11, the second nitride compound semiconductor layer 2 and the third nitride compound semiconductor layer 3. The etching process is preferably conducted in a wet chemical manner, using KOH as the etchant. The etching process is used to produce coupling-out structures 14 on the surface of the device which is located opposite the carrier 13, which surface may in particular be the radiation exit area.

It has turned out that the etching process stops especially at the boundary surfaces on which the side facets of the pyramidal structures had previously been formed. Ending at the side facets are vertically extending dislocations through which the etchant preferably penetrates the semiconductor material—which slows down or even stops the etching process at the side facets. The side facets of the pyramidal structures therefore act as an etch stop layer.

At least part of the side facets 14a of the coupling-out structures 14 can therefore be constituted by a [1-101] crystal face or an [11-22] crystal face. The coupling-out structures 14 are advantageously three-dimensional structures which are at least partially inverse to the non-planar three-dimensional structures produced when growing the third nitride compound semiconductor layer 3.

The size and shape of the coupling-out structures 14 can therefore be influenced in particular by the growth period and the growth conditions during the production of the third nitride compound semiconductor layer 3. Furthermore, the spatial distribution and size of the coupling-out structures can be influenced in a targeted manner by the previously deposited masking layer 11. Depending on the size of the coupling-out structures 14, this not only improves radiation coupling-out but also allows the spatial radiation characteristics to be specifically influenced, if necessary. Consequently, the spatial angle can be used to influence radiation characteristics, and thus the far field of the optoelectronic device, while the epitaxy process is still ongoing.

The coupling-out structures 14 may also comprise further recesses in the fourth nitride compound semiconductor layer 4 which do not match the inverse pyramidal structures of the third nitride compound semiconductor layer 3. These recesses are illustrated in FIG. 7 in the form of the small pyramids next to and between the large pyramids and are produced in the etching process based on the previously planar regions of the surface of the fourth nitride compound semiconductor layer 4. In this case, the etching process stops in particular at dislocations which are still present and which are parallel to the crystallographic c-plane. Vertically extending dislocations, through which the etchant preferably penetrates the semiconductor material, usually end at these transversely extending dislocations. Consequently, also dislocations which extend parallel to the c-plane have an effect similar to an etch stop layer.

The invention is not restricted by the description given with reference to the exemplary embodiments. Rather, the invention encompasses any novel feature and any combination of features, in particular any combination of features in the claims, even if this feature or this combination is not itself explicitly indicated in the claims or exemplary embodiments.

The invention claimed is:

1. A method for producing a nitride compound semiconductor device, the method comprising:
    growing a first nitride compound semiconductor layer onto a growth substrate;
    depositing a masking layer;
    growing a second nitride compound semiconductor layer onto the masking layer;
    growing a third nitride compound semiconductor layer onto the second nitride compound semiconductor layer such that the third nitride compound semiconductor layer has non-planar structures;
    growing a fourth nitride compound semiconductor layer onto the non-planar structures such that the fourth nitride compound semiconductor layer has an essentially planar surface;
    growing a functional layer sequence of the nitride compound semiconductor device;
    connecting a side of the functional layer sequence located opposite to the growth substrate to a carrier;
    removing the growth substrate; and
    producing coupling-out structures on a surface of the nitride compound semiconductor device facing away from the carrier by an etching process which removes at least part of the first, second and third nitride compound semiconductor layers,
    wherein the method is performed in the recited order.

2. The method according to claim 1, wherein the non-planar structures are pyramidal structures.

3. The method according to claim 1, wherein the non-planar structures include side facets which are constituted by a [1-101] crystal face or an [11-22] crystal face.

4. The method according to claim 1, wherein at least part of the coupling-out structures are constituted by a [1-101] crystal face or an [11-22] crystal face.

5. The method according to claim 1, wherein the non-planar structures have an average height of between 1 μm and 5 μm.

6. The method according to claim 1, wherein the etching process is a wet chemical etching process.

7. The method according to claim 1, wherein the second nitride compound semiconductor layer and/or the fourth nitride compound semiconductor layer are produced at a growth temperature higher than 1,050° C.

8. The method according to claim 1, wherein the third nitride compound semiconductor layer is produced at a growth temperature which is by at least 40° C. lower than the growth temperature of the second nitride compound semiconductor layer.

9. The method according to claim 1, wherein the nitride compound semiconductor layers are produced by a metal organic vapor phase epitaxy, wherein $NH_3$ is used as a reaction gas, and wherein an $NH_3$ gas flow is at least 70% smaller in an formation of the second and third nitride compound semiconductor layers than in an formation of the fourth nitride compound semiconductor layer.

10. The method according to claim 1, wherein the masking layer is a silicon nitride layer.

11. The method according to claim 1, wherein the masking layer has a plurality of openings of an average lateral extent of between 100 nm and 1,000 nm.

12. The method according to claim 1, wherein the growth substrate is a sapphire substrate.

13. The method according to claim 1, wherein the functional layer sequence includes an n-type semiconductor region, a p-type semiconductor region, and an active layer disposed between the n-type semiconductor region and the p-type semiconductor region.

14. The method according to claim 1, wherein the nitride compound semiconductor device is a light-emitting diode.

* * * * *